United States Patent [19]

Murden et al.

[11] Patent Number: 5,684,419

[45] Date of Patent: *Nov. 4, 1997

[54] N-BIT ANALOG-TO-DIGITAL CONVERTER WITH N-1 MAGNITUDE AMPLIFIERS AND N COMPARATORS

[75] Inventors: Frank Murden; Carl W. Moreland, both of Greensboro, N.C.

[73] Assignee: Analog Devices, Inc., Norwood, Mass.

[*] Notice: The term of this patent shall not extend beyond the expiration date of Pat. No. 5,554,943.

[21] Appl. No.: 347,909

[22] Filed: Dec. 1, 1994

[51] Int. Cl.[6] .................... H03M 1/12; H03M 1/46
[52] U.S. Cl. .................. 327/104; 327/65; 327/563; 341/159; 341/161
[58] Field of Search .................... 327/52, 65, 89, 327/104, 306, 560, 563; 330/252, 253, 254, 311; 341/156, 159, 161

[56] References Cited

U.S. PATENT DOCUMENTS

| | | | |
|---|---|---|---|
| 4,005,410 | 1/1977 | Michael et al. | 340/347 |
| 4,599,602 | 7/1986 | Matzuzawa et al. | 341/161 |
| 4,931,797 | 6/1990 | Kagawa et al. | 327/77 |
| 5,126,742 | 6/1992 | Schmidt et al. | 341/156 |
| 5,198,781 | 3/1993 | Kusakabe | 330/257 |
| 5,227,681 | 7/1993 | Koyama et al. | 327/65 |
| 5,307,067 | 4/1994 | Kimura et al. | 341/159 |
| 5,313,207 | 5/1994 | Kouno et al. | 341/156 |
| 5,392,045 | 2/1995 | Yee | 327/65 |
| 5,399,988 | 3/1995 | Knierim | 330/252 |
| 5,550,492 | 8/1996 | Murden | 327/65 |

FOREIGN PATENT DOCUMENTS

| | | |
|---|---|---|
| 1955555 | 5/1971 | Germany . |
| 2645606 | 4/1978 | Germany . |
| 60-172823 | 9/1985 | Japan . |

*Primary Examiner*—Timothy P. Callahan
*Assistant Examiner*—Terry L. Englund
*Attorney, Agent, or Firm*—Hale and Dorr LLP

[57] ABSTRACT

A serial-type A/D converter uses magnitude amplifiers ("magamps") and comparators for effecting the conversion of analog signals to Gray scale code signals that are then converted to binary digital signals by a Gray scale code-to-binary portion of the serial-type A/D converter. More specifically, a serial-type A/D converter uses an n-bit converter that has n−1 magamps and n-comparators. The n−1 magamps are cascaded such that the $V_{OL}$ and $V_{OH}$ outputs of a stage are the inputs to the next stage. The output of the comparators are input to the Gray scale code-to-binary portion of the serial A/D converter. The latching of the comparators occurs outside of the magamps. This allows for the parallel latching of the n comparators. The speed of the serial-type A/D converter is determined by the bandwidth of the magamps. The serial-type A/D converter includes an offset method that significantly reduces the effects of early voltage, $V_A$, on the output waveforms. Each stage of the serial-type A/D converter may have any desired gain and not limited to a particular gain.

82 Claims, 10 Drawing Sheets

N-BIT ANALOG-TO-DIGITAL CONVERTER WITH N-1 MAGNITUDE AMPLIFIERS AND N COMPARATORS

This invention was made with Government support under contract F29601-89-C-0014 and subcontract SC0014-89-0024 awarded by the Air Force. The Government has certain rights in the invention.

FIELD OF THE INVENTION

The present invention relates to analog-to-digital converters. More specifically, the present invention relates to high speed, low voltage serial-type analog-to-digital converters.

BACKGROUND OF THE INVENTION

There are a variety of analog-to-digital ("A/D") converters. For example, there are parallel encoder (or flash) A/D converters, multistage A/D converters, successive approximation A/D converters, voltage-to-frequency A/D converters, dual-ramp A/D converters, and staircase A/D converters. There is such a variety because the need for converters has heightened with the advent of single-chip large scale integration ("LSI") microprocessors. In fact, in some cases, it is desirable to include such converters on the same chip with the microprocessor.

In many cases, there is the desire to have very fast conversion to maintain the speed of the overall system. The types of A/D converters typically used in these situations have been flash and multistage flash A/D) converters. As larger and larger A/D converters were being constructed, the resulting large dies had a great deal of parasitics that had to be driven. This forced the technology in the opposite direction, which was to make A/D converters smaller and smaller. This brought about the advent of the consideration of replacing flash and multistage flash A/D converters with serial-type A/D converters because in many ways they were easier to construct on a chip than multistage flash A/D converters and they can in some cases, achieve the speed of flash A/D converters.

Serial-type A/D converters typically convert analog signals first into Gray scale code and then into binary code. They are configured to have a series of cascaded analog cells to which the Gray scale code-to-binary processing system connects. Each cell of the series of cascaded analog cells has a folding cell which will process the differential input signals, $V_{IL}$ and $V_{IH}$, according to FIG. 1.

The signals input to the differential input of the folding cell are shown in FIG. 1A. As $V_{IH}$ increases and $V_{IL}$ decreases, there is a single crossing at 100. This crossing point is the input level where the comparator of the folding cell is tripped and the $V_{IH}$ and $V_{IL}$ signals are folded to form the intermediate signals $V_1$ and $V_2$ that are shown in FIG. 1B. These intermediate signals are output from the current switching portion of the folding cell. When $V_1$ and $V_2$ are folded as shown in FIG. 1B, the folded signals converge but do not cross as shown at 102.

In order to obtain the desired $V_{OH}$ and $V_{OL}$ outputs for input to the next stage, it is necessary to further process the $V_1$ and $V_2$ signals. The processing that is necessary is to offset the $V_1$ and $V_2$ signals to align them. Once the offset has been applied, the alignment shown in FIG. 1C results. This alignment has crossing points at 104 and at 106. Thereafter, the $V_{OH}$ and $V_{OL}$ signals are input to the next stage of the serial-type A/D converter.

The signals output from the comparator of the folding cell are input to the Gray scale code-to-binary section of the serial-type A/D converter which result in the binary signals that are used in the digital portions of a much larger circuit.

The construction of the A/D converter is quite important. Problems that may arise in the analog cells include the maintenance of linearity of the outputs, desensitizing early voltage effects, proper offset of the $V_1$ and $V_2$ signals, complexity of the implementation of the circuit in silicon, the production of unwanted and uncompensated parasitics, the need to attain proper device matching within each stage of the serial-type A/D converter, etc.

The present invention overcomes these problems and provides a serial-type A/D converter that has increased linearity, insensitivity to early voltage effects at the crossover points, and is not limited to a specific gain. The serial-type A/D converter of the present invention will be described in detail in the remainder of the specification referring to the drawings.

SUMMARY OF THE INVENTION

The present invention is a serial-type A/D converter that uses magnitude amplifiers ("magamps"), which include a comparator for effecting the conversion of analog signals to Gray scale code signals. The Gray scale code-to-binary portion of the serial-type A/D converter converts the Gray scale code signals to binary signals.

The present invention is an n-bit converter that has n−1 magamps and n-comparators. The n−1 magamps are cascaded such that the $V_{OL}$ and $V_{OH}$ outputs of a stage are the inputs to the next stage. The outputs of the comparators are the differential input to the Gray scale code-to-binary portion of the serial A/D converter of the present invention.

The serial-type A/D converter of the present invention is a differential input A/D converter. The switching of the comparators occurs at the mid-scale point of the analog input signal. This allows for the parallel latching of the n comparators in the Gray scale code-to-binary converter. The speed of the serial-type A/D converter of the present invention is determined by the bandwidth of the magamps.

The serial-type A/D converter of the present invention includes an offset method that significantly reduces the effects of early voltage, $V_A$, of the switching transistors. Each stage of the serial-type A/D converter of the present invention may have a desired gain and not limited to a particular gain requiring a precise gain compensating circuit.

An object of the present invention is to provide a n-bit converter with n−1 magamps, n comparators, and a Gray scale code-to-binary block for converting analog signals to digital signals.

Another object of the present invention is to provide a serial-type A/D converter that has cascaded magamps and each of the magamps may have a desired gain.

A further object of the present invention is to provide a serial-type A/D converter that has an offset method that significantly reduces the effects of early voltage, $V_A$, on the magamp linearity.

A still further object of the present invention is to provide a serial-type A/D converter that includes a parallel reference circuit for providing feedforward gain and offset control of each magamp.

These and other objects of the present invention will be described in greater detail in the remainder of the specification referring to the drawings.

DETAILED DESCRIPTION OF THE PRESENT INVENTION

The present invention is a serial-type A/D converter. This converter is a n-bit converter with n−1 magnitude amplifiers and n comparators. The magamp of the serial-type A/D converter of the present invention may be configured with an inverted cascode amplifier and a matching reference.

Figure 2:
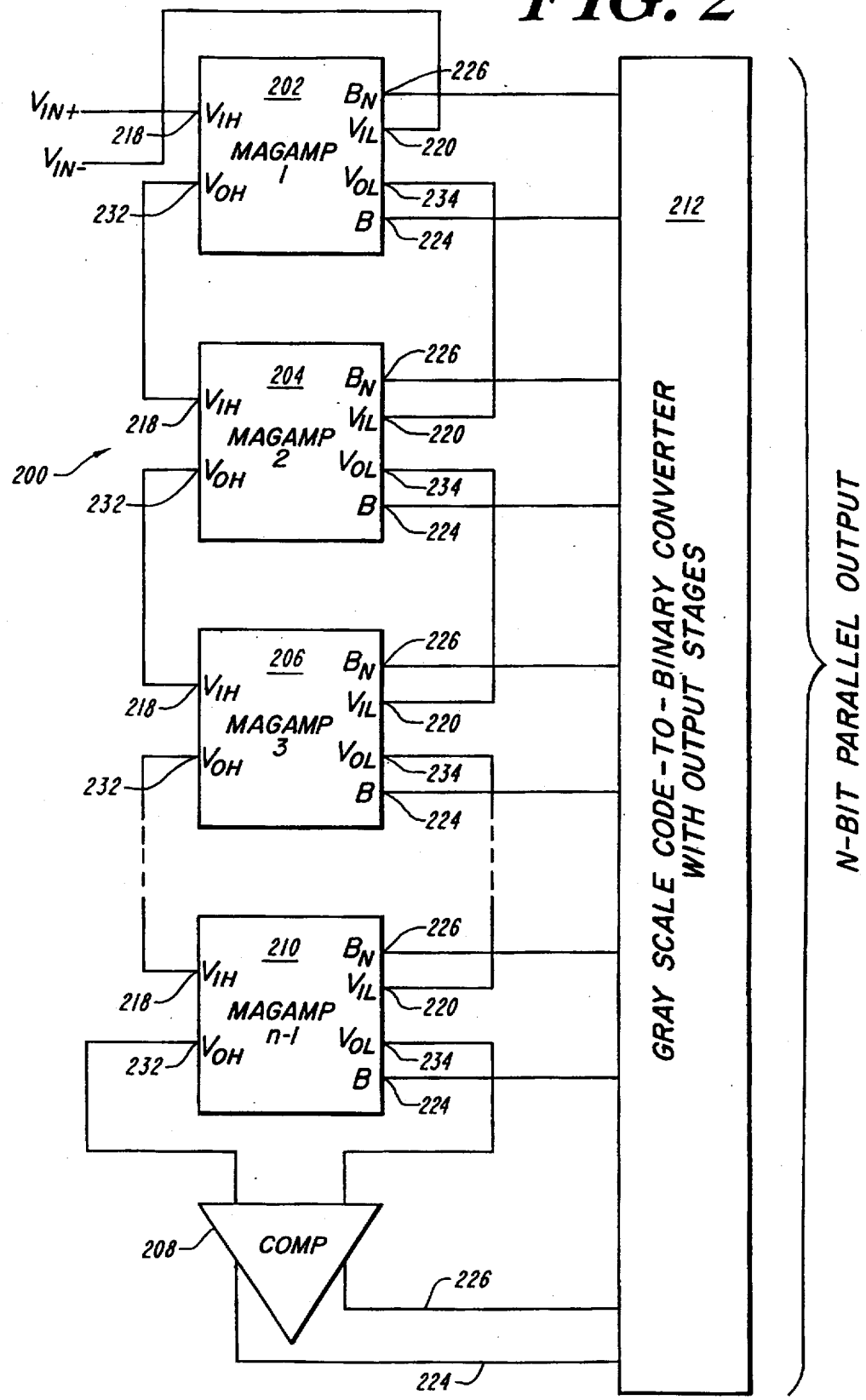
FIG. 2 shows a first embodiment of the serial-type A/d converter of the present invention.

Referring to FIG. 2, the serial-type A/D converter of the present invention is shown generally at 200. As is shown in FIG. 2, the A/D converter of the present invention includes magamps 202, 204, 206, and 210, and comparator 208 which are cascade connected, and Gray scale code-to-binary conversion unit with output stages 212. The output of Gray scale code-to-binary converter with output stages is an n-bit parallel digital signal. However, it is understood that the output could be a serial digital signal.

The serial-type A/D converter of the present invention may have n stages. N−1 stages include a magamp. In FIG. 2, only the magamps of stages 1–3 and n−1 are shown. The final stage does not perform amplification but only acts as a comparator.

In FIG. 2, magamp 1, 202, has two analog inputs. These are the analog signal input to the $V_{IH}$ input at 218 and the analog signal input to the $V_{IL}$ input at 220. These signals constitute a differential input to the magamp. Of these inputs $V_{IH}$ is connected to the $V_{IN}+$ input and $V_{IL}$ is connected to the $V_{IN}-$ input.

As is shown in FIG. 2, certain outputs of magamp 1, 202, are input to magamp 2, 204. Specifically, the signal output from the $V_{OH}$ output at 232 of magamp 1, 202, is input to the $V_{IH}$ input of magamp 2, 204, at 218. Similarly, the signal output from the $V_{OL}$ output at 234 of magamp 1, 202, is input to the $V_{IL}$ input of magamp 2, 204, at 220. With regard to the outputs, $V_{OH}$ is the "+" output and $V_{OL}$ is the "−" output. This same method of connecting the $V_{OH}$ and $V_{OL}$ outputs of one stage to the $V_{IH}$ and $V_{IL}$ inputs of the next successive stage is repeated for the n-stages of the serial-type A/D converter of the present invention.

Each of the n−1 magamps of the serial-type A/D converter of the present invention and comparator 208 provides a differential digital output to Gray scale code-to-binary unit with output stages 212. These outputs are the B output at 224 and $B_N$ output at 226. As will be shown, except for comparator 208, these are the outputs from the comparator that are used to drive the current switching transistors of the magamp. The signals output from B and $B_N$ outputs are processed by Gray scale code-to-binary converter with output stages 212 to produce the n-bit parallel digital signal.

All of the n−1 magamps on the serial-type A/D converter of the present invention have substantially the same construction. Therefore, except as otherwise indicated, the description of magamp 1, 202, that follows, applies equally to magamp 2, 204, magamp 3, 206, and magamp n−1, 210.

Figure 3:
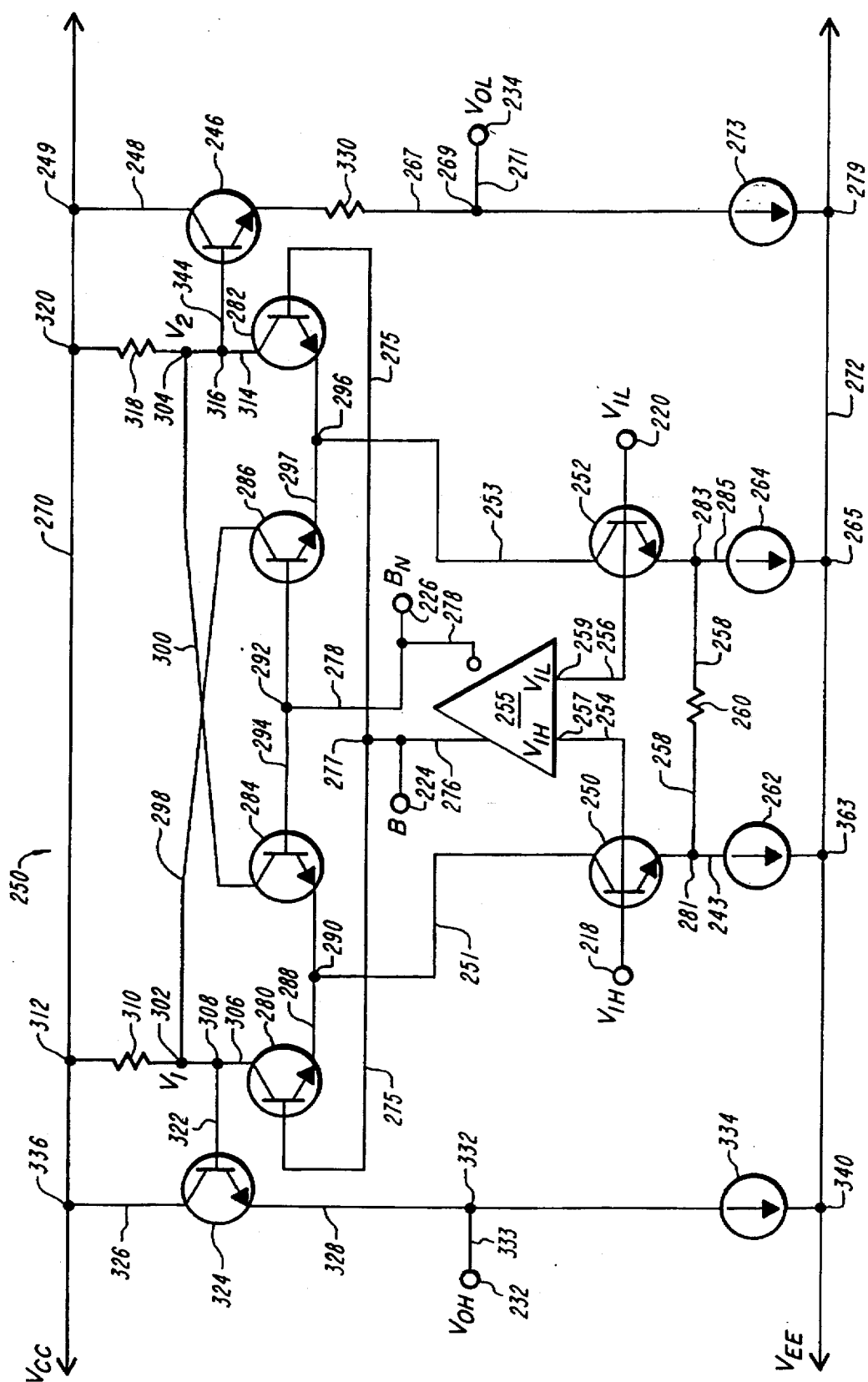
FIG. 3 shows a magamp of the first embodiment of the serial-type A/D converter of the present invention.

Referring to FIG. 3, a schematic diagram of a magamp of the first embodiment of the A/D converter of the present invention is shown generally at 249. The analog inputs to magamp 1, 202, are input at the $V_{IH}$ and $V_{IL}$ inputs at 218 and 220, respectively, which are the differential inputs of the differential amplifier of the magamp. These analog inputs are input to the bases of bipolar npn transistors 250 and 252, respectively. These transistors form a differential input pair. The analog inputs also are input to the $V_{IH}$ and $V_{IL}$ inputs to comparator 255 at 257 and 259, respectively.

Figure 1A:
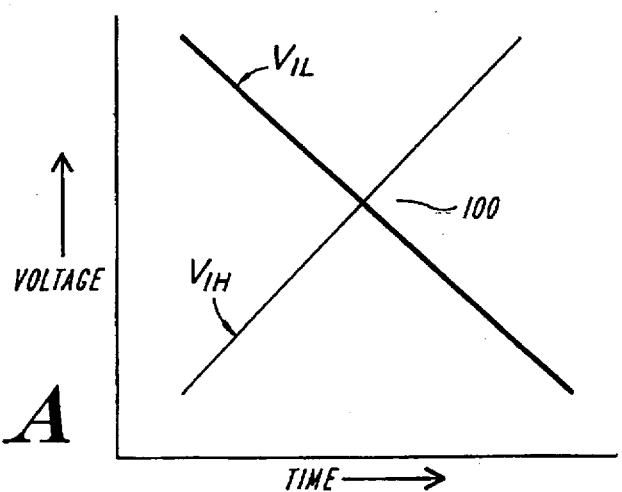
FIG. 1A is a graph of inputs to serial-type A/D converter that has a folding cell.

Referring to FIGS. 1A and 3, the analog signals input to comparator 255 are shown in FIG. 1A. The signals output from comparator 255 are used to drive the current switching transistors that includes npn transistors 280, 282, 284, and 286, as will be described.

The differential input amplifier that includes bipolar npn transistors 250 and 252 connects between $V_{CC}$ 270 and $V_{EE}$ 272. Referring first to the first branch of the differential input amplifier that includes transistor 250, the emitter of transistor 250 connects to $V_{EE}$ through current source 262. The collector of transistor 250 connects to $V_{CC}$ 270 though transistor pair 280 and 284, and load resistors 310 and 318. Specifically, line 251 connects the collector of transistor 250 to node 290 in line 288, and line 288 connects to the emitters of transistors 280 and 284. Line 306 connects the collector of transistor 280 to $V_{CC}$ 270 at node 312. Load resistor 310 is disposed in line 306.

The collector of transistor 284 connects to $V_{CC}$ 270 at node 320 via line 300, node 304, line 314, and load resistor 318. Line 300 connects the collector of transistor 284 to node 304. Node 304 is disposed in line 314. Line 314 connects the collector of transistor 282 to $V_{CC}$ 270 at node 320. Load resistor 318 is disposed in line 314 between node 304 and node 320 on $V_{CC}$ 270.

Node 308 is disposed in line 306 that connects between the collector of transistor 280 and $V_{CC}$ 270 at node 312. Node 302 also is disposed in line 306. Line 298 connects node 302 to the collector of npn bipolar transistor 286. This transistor will be discussed subsequently.

With regard to the output associated with the first branch, line 322 connects to node 308 and the base of bipolar npn transistor 324. Line 326 connects the collector of transistor 324 to $V_{CC}$ 270 at node 336. Line 328 connects the emitter of transistor 324 to $V_{EE}$ 272 at node 340. Current source 334 is disposed in line 328, and node 332 is disposed in line 328 between transistor 324 and current source 334. Line 333 connects between node 332 and the $V_{OH}$ output at 232.

Now referring to the second branch of the differential input amplifier including transistor 252, the emitter of input transistor 252 connects to $V_{EE}$ 272 at node 265 through current source 264. Line 258 connects between node 281 in line 243 and node 283 in line 285. Resistor 260 is disposed in line 258. Transistors 250 and 252, and resistor 260 operate conventionally for linear conversion of the analog inputs.

The collector of transistor 252 connects to $V_{CC}$ 270 though transistor pair 282 and 286. Line 253 connects to the collector of transistor 252 at node 296 in line 297. Line 297 connects the emitters of transistors 282 and 286.

As stated, line 314 connects the collector of transistor 282 to $V_{CC}$ 270 at node 320. Load resistor 318 is disposed in line 314.

The collector of transistor 286 connects to $V_{CC}$ 270 at node 312 via line 298, node 302, line 306, and load resistor 310. Line 298 connects the collector of transistor 286 to node 302. Node 302 is disposed in line 306. Line 306 connects the collector of transistor 280 to $V_{CC}$ 270 at node 312. Load resistor 310 is disposed in line 306 between node 302 and node 312 on $V_{CC}$ 270.

With regard to the output associated with the second branch, node 316 is disposed in line 314 that connects between the collector of transistor 282 and $V_{CC}$ 270 at node 320. As stated, node 304 also is disposed in line 314. Line 344 connects to node 316 and the base of bipolar npn transistor 246. Line 248 connects the collector of transistor 246 to $V_{CC}$ 270 at node 249. Line 267 connects the emitter of transistor 246 to $V_{EE}$ 272. Current source 273 is disposed in line 267 and node 269 is disposed in line 267 above current source 273. Offset resistor 330 is disposed in line 267 between node 269 and transistor 246. This resistor is used to align the signal, as shown in FIG. 1C.

Line 271 connects between node 269 and the $V_{OL}$ output at 234. The $V_{OH}$ and the $V_{OL}$ outputs are connected to the next magamp stage.

Figure 4:
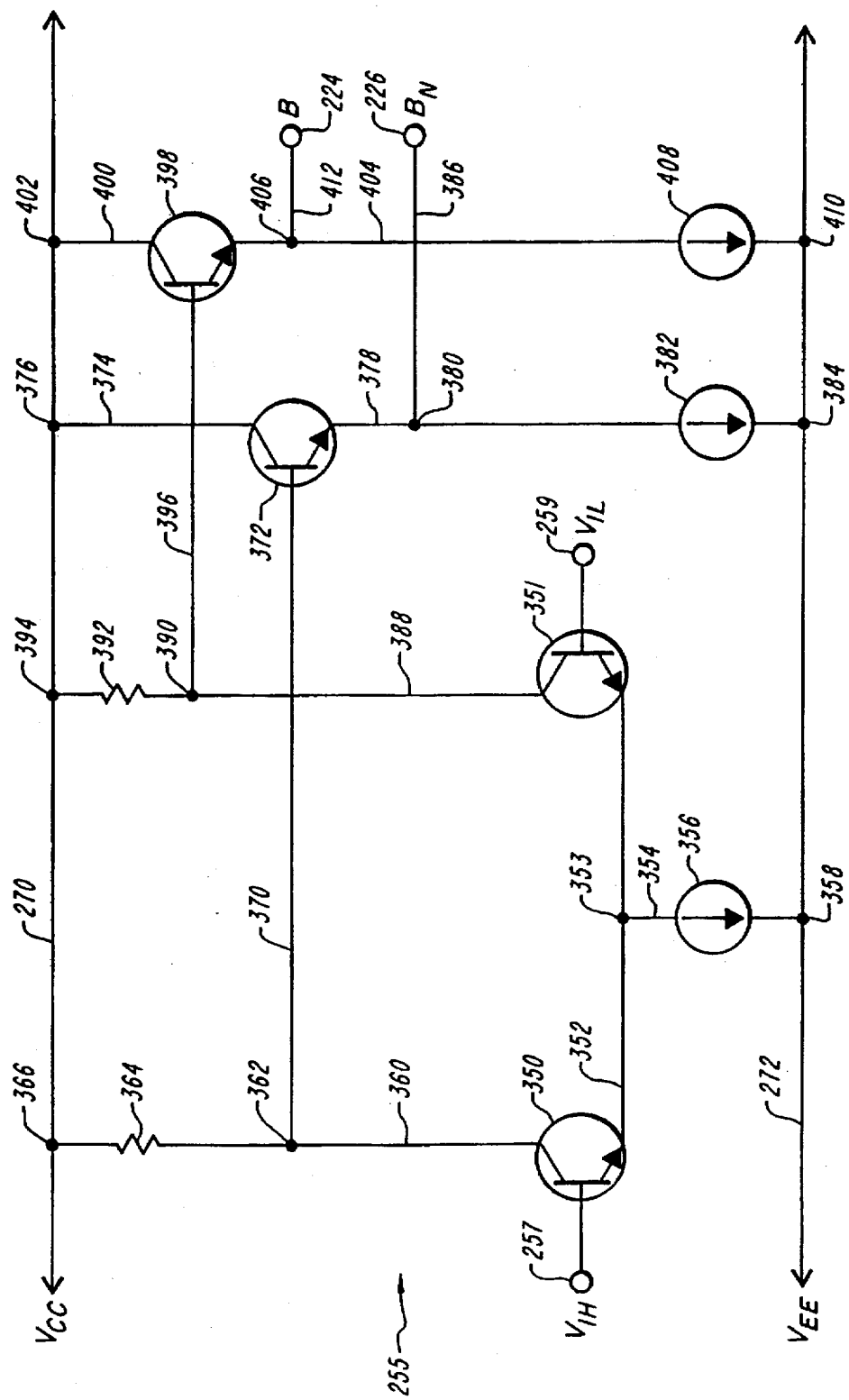
FIG. 4 shows a comparator that may be part of the magamp shown in FIG. 3.

Comparator 255 is shown in FIG. 4. According to FIG. 4, comparator 255 includes a differential input transistor pair, bipolar npn transistors 350 and 351. The $V_{IH}$ input at 257 connects to the base of transistor 350. Line 360 connects the collector of transistor 350 to $V_{CC}$ 270 at node 366. Load resistor 364 is disposed in line 360. Similarly, the $V_{IL}$ input at 259 connects to the base of transistor 351. Line 388 connects the collector of transistor 351 to $V_{CC}$ 270 at node 394. Load resistor 392 is disposed in line 388. The emitters of input transistors 350 and 351 are coupled by line 352. Common node 353 is disposed in line 352. Line 354 connects common node 353 to $V_{EE}$ 272 at node 358. Current source 356 is disposed in line 354. This circuit operates conventionally.

Node 362 is disposed in line 360 between the collector of transistor 350 and load resistor 364. Line 370 connects node 362 to the base of bipolar npn transistor 372. Line 374 connects the collector of transistor 372 to $V_{CC}$ 270 at node 376. Line 378 connects the emitter of transistor 372 to $V_{EE}$ 272 at node 384. Current source 382 is disposed in line 378. Node 380 is disposed in line 378 between transistor 372 and current source 382. Line 386 connects between node 380 and the $B_N$ output at 226 of comparator 255.

Node 390 is disposed in line 388 between the collector of transistor 351 and load resistor 392. Line 396 connects node 390 to the base of bipolar npn transistor 398. Line 400 connects the collector of transistor 398 to $V_{CC}$ 270 at node 402. Line 404 connects the emitter of transistor 398 to $V_{EE}$ 272 at node 410. Current source 408 is disposed in line 404. Node 406 is disposed in line 404 between transistor 398 and current source 408. Line 412 connects between node 406 and the B output at 224 of comparator 255.

Again referring to FIG. 3, the B signal of comparator 255 on line 276 connects to node 277 that is disposed in line 275. Line 275 connects to the bases of transistors 280 and 282 of the current switching transistors. The $B_N$ signal of comparator 255 on line 278 connects to node 292 that is disposed in line 294. Line 294 connects to the bases of transistors 284 and 286 of the current switching transistors. As will be discussed in detail, the current switching transistors are used to fold the input signals as shown, for example, in FIG. 1B.

Referring to FIGS. 1–4, when the $V_{IH}$ input at 218 is LOW and the $V_{IL}$ input at 220 is HIGH, as shown in FIG. 1A, the output of comparator 255 on line 276 for the B output is LOW and on line 278, the negative true output, for the $B_N$ output is HIGH. This will cause transistors 284 and 286 to conduct. As such, the $V_1$ and $V_2$ signals will lie on the unfolded curves for the $V_1$ and $V_2$ signals in FIG. 1B. During this time, transistors 280 and 282 of the current switching circuit do not conduct.

Taking the other extreme, when the $V_{IH}$ input at 218 is HIGH and the $V_{IL}$ input at 220 is LOW as shown FIG. 1A, the outputs of comparator 255 switch such that the B output on line 276 is HIGH and the $B_N$ output on line 278 is LOW. This will cause transistors 284 and 286 to stop conducting and transistors 280 and 282 to conduct. This will result in the $V_1$ and $V_2$ signals lying on the folded curves for the $V_1$ and $V_2$ signals in FIG. 1B. As the differential inputs change within limits, the $V_1$ and $V_2$ signals will lie along the folded and unfolded curves shown in FIG. 1B. However, when they are equal, all of the current switching transistors conduct equally. At this time, the slew rate at $V_1$ and $V_2$ is zero, and the state of the comparator does not affect these signals. More specifically, when the $V_{IL}$ and $V_{IH}$ inputs are centered or equal, the output of comparator 255 is centered and there are equal currents in transistors 250 and 252. These currents are split evenly in transistors 280, 282, 284, and 286 of the current switching circuit. These currents recombine in the load resistors 310 and 318. When one of the magamps of the system are in this state, they all can be latched in parallel.

To align the $V_1$ and $V_2$ signals for the next stage magamp, offset resistor 330 offsets the $V_2$ signal ½ full scale, as shown in FIG. 1C. The offset is done after load resistors 310 and 318 to remove errors at midscale due to the early voltage effects of transistors 280, 282, 284, and 286. The folded and offset signals (as shown in FIG. 1C) are fed to the next stage magamp.

The configuration of the circuit, as shown in FIG. 3, has output transistors 324 and 246. These transistors buffer load resistors 310 and 318 from the inputs of the next stage. The gain of the magamps is set by load resistors 310 and 318, resistor 260, and the dynamic resistance of transistors 250 and 252. The offset across resistor 330 is then set to ½ of the full scale output range. The circuit designer can select any desired gain for any magamp stage.

The magamp configuration of FIG. 3 has the added advantage that the latching function is outside of the comparator and, therefore, outside of the analog path. As such, the latch for the circuit is connected to the B signal output at 224 and the $B_N$ signal output at 226.

FIGS. 5–8 are directed to a second embodiment of the serial-type A/D converter of the present invention. In describing the second embodiment of the present invention, the elements of this second embodiment that are the same as elements of the first embodiment will have the same reference numbers.

Figure 5:
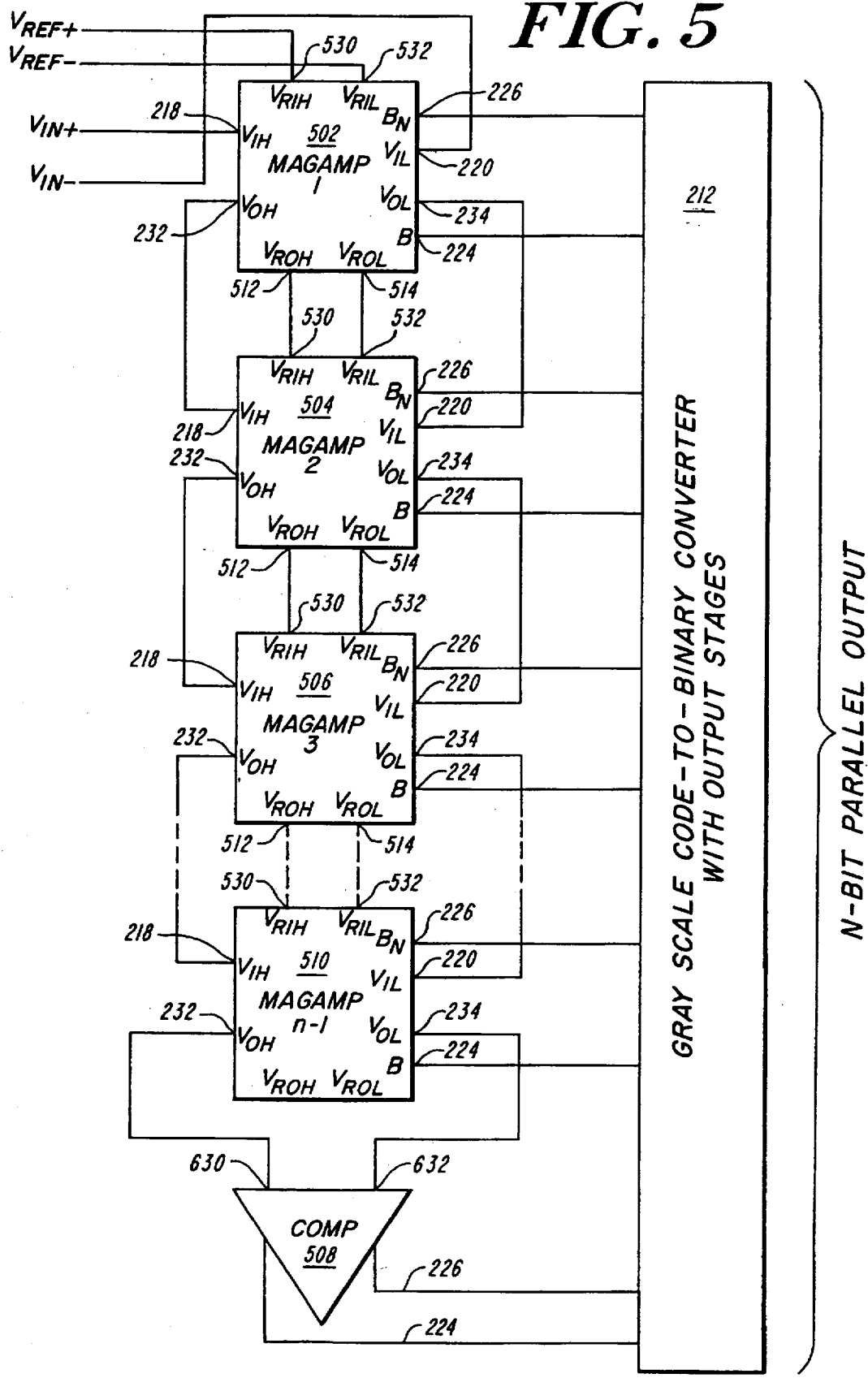
FIG. 5 shows a second embodiment of the serial-type A/D converter of the present invention.

Referring to FIG. 5, the second embodiment of the serial-type A/D converter of the present invention includes magamp 1, 502, magamp 2, 504, magamp 3, 506, magamp n–1, 510, and comparator 508. All of the n–1 magamps of the second embodiment of the serial-type A/D converter of the present invention have substantially the same construction. Therefore, except as otherwise indicated, the description of magamp 1, 502, applies equally to magamp 2, 504, magamp 3, 506, and magamp n−1, 510.

Magamp 1, 502 has two analog inputs. One analog signal is input to the $V_{IH}$ input at 218 and the other analog input is input to $V_{IL}$ at 220. These signals constitute a differential input to the magamp. Certain outputs of magamp 1, 502, are input to magamp 2, 504. Specifically, the signal output from the $V_{OH}$ output at 232 of magamp 1, 502, is input to the $V_{IH}$ input of magamp 2, 504, at 218, and, in like manner, the signal output from the $V_{OL}$ output at 234 of magamp 1, 502, is input to the $V_{IL}$ input at 220 of magamp 2, 504. This same method of connecting the $V_{OH}$ and $V_{OL}$ outputs of one stage to the $V_{IL}$ and $V_{IL}$ inputs of the next successive stage is repeated for the n−1 stages of the serial-type A/D converter of the present invention. As stated, the final stage is only a comparator and is not an amplifier.

Magamp 1, 502, has two reference inputs for setting the full scale input range. One reference input is the signal input to the $V_{RIH}$ input at 530 and the other is the signal input to the $V_{RIL}$ input at 532. Magamp 1, 502, also has two reference outputs which match the full scale range of this signals output from the $V_{OH}$ and $V_{OL}$ outputs at 232 and 234, respectively. One reference output is the signal at the $V_{ROH}$ output at 512 and the other is the signal at the $V_{ROL}$ output at 514. The signals output from the $V_{ROH}$ and $V_{ROL}$ outputs of one magamp stage connect to the $V_{RIH}$ and $V_{RIL}$ inputs of the next successive magamp stage, respectively.

The n−1 magamps of the serial-type A/D converter of the present invention provides two differential outputs to Gray scale code-to-binary unit with outputs stages 212. The first differential output is the signals output from the B output at 224 and from the $B_N$ output at 226. These are the outputs from the comparator of the magamp unit before they are processed by the current switching transistors. The signals output from B and $B_N$ outputs are processed by Gray scale code-to-binary converter with output stages 212 to produce the n-bit parallel digital signal.

Figure 6:
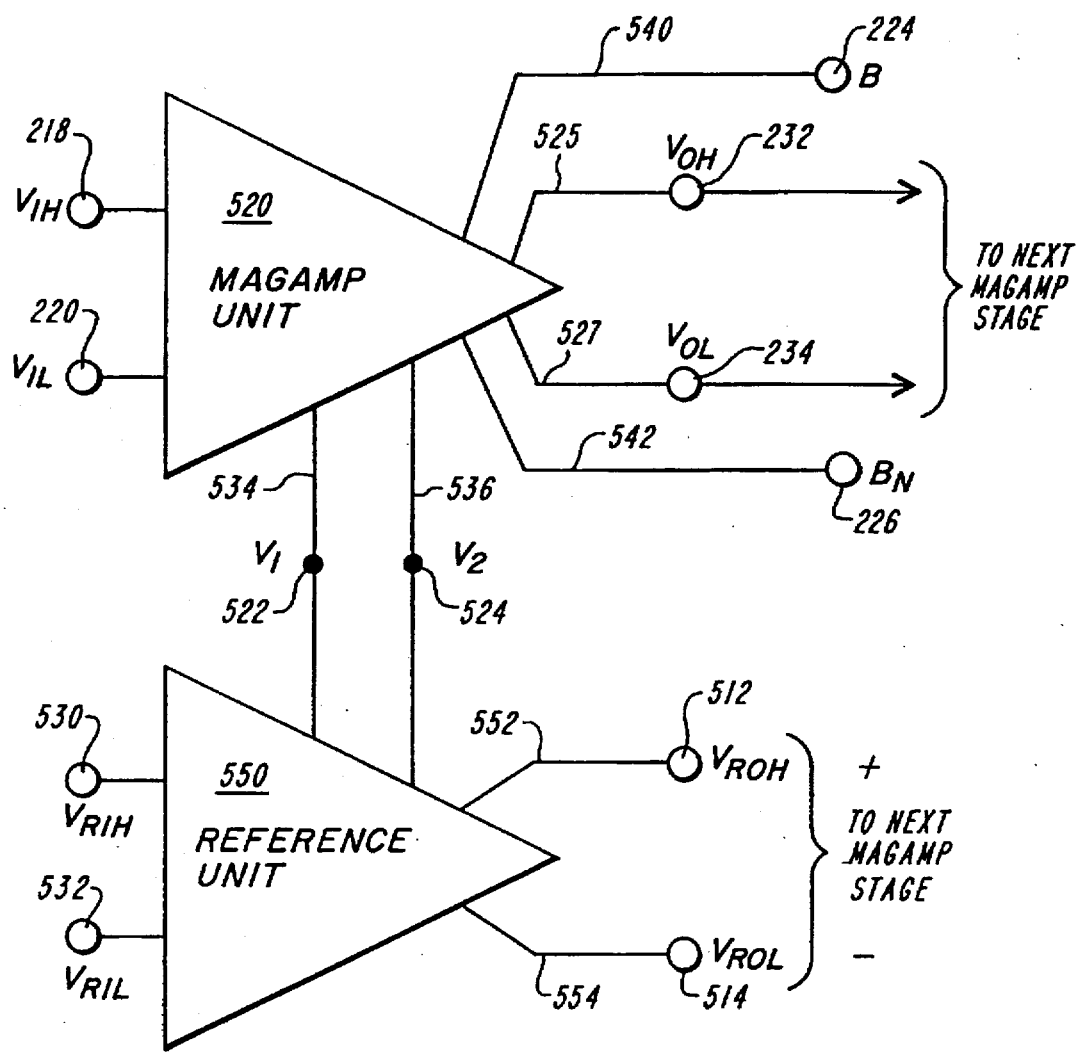
FIG. 6 shows a magamp of the second embodiment of the serial-type A/D converter of the present invention.

Referring to FIG. 6, the elements of magamp 1, 502, are shown. The main elements of magamp 1, 502, are magamp unit 520 and reference unit 550. Magamp unit 520 is an inverted, cascoded amplifier that includes a current switching circuit. Reference unit 550 is used for setting the full-scale input range of magamp unit 520 and applying the reference signals to the next successive magamp stage.

The inputs to magamp unit 520 are the analog signals input to the $V_{IH}$ and $V_{IL}$ inputs at 218 and 220, respectively. These are the differential inputs to magamp unit 520.

One of the outputs of magamp unit 520 is the differential output that is input to Gray scale code-to-binary unit with output stage 212. This differential output is on line 540 that connects to the B output at 224 and is on line 542 that connects to the $B_N$ output at 226.

Another differential output is on line 525 that connects to the $V_{OH}$ output at 232 and on line 527 that connects to the $V_{OL}$ output at 234.

A differential signal connected to magamp unit 520 is the differential reference on lines 534 and 536. The signal on line 534 is the signal $V_1$ that is at node 522 and the signal on line 536 is the signal $V_2$ that is at node 524. The $V_1$ and $V_2$ nodes are used by the reference unit to supply offset currents to align the signals as shown in FIG. 1C.

The differential output of reference unit 550 is on lines 552 and 554. The output on line 552 is input to $V_{ROH}$ output at 512 and the $V_{ROL}$ output at 514. These are the reference voltage inputs to the next succession magamp stage.

Figure 7:
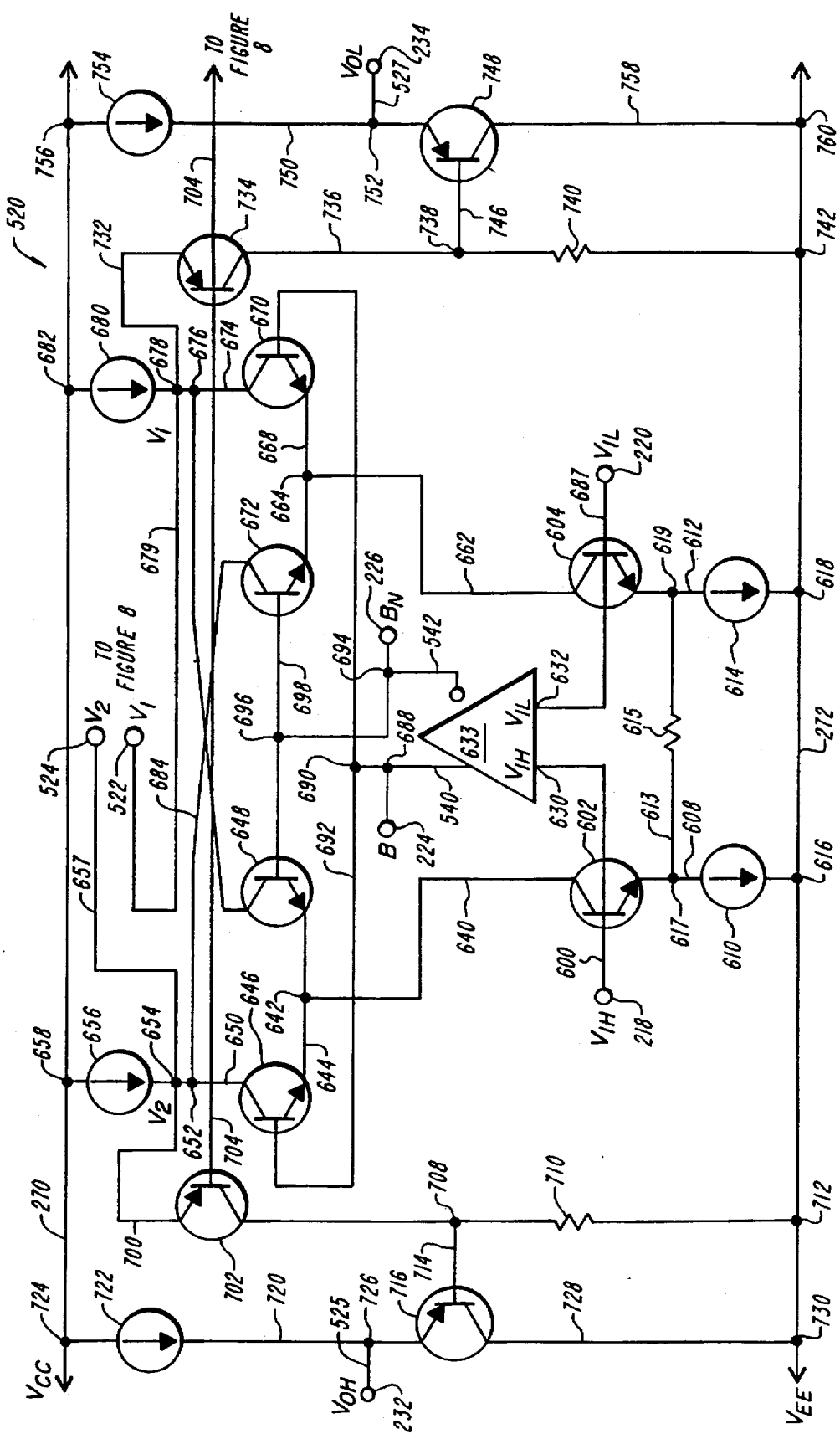
FIG. 7 shows the magamp unit of the magamp shown in FIG. 6.
Figure 8:
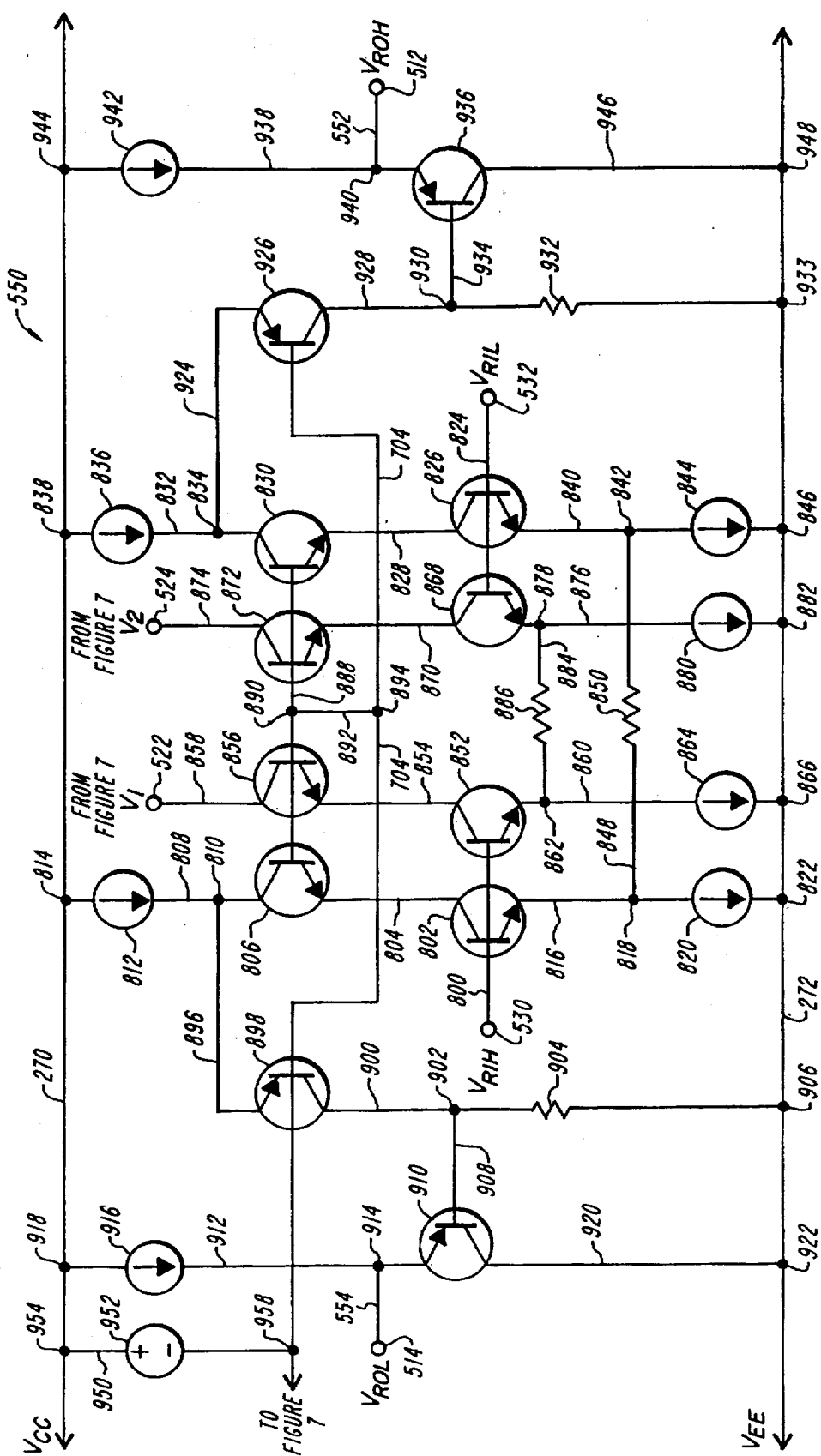
FIG. 8 shows the reference unit of the magamp shown in FIG. 6.

Referring to FIGS. 7 and 8, magamp unit 520 will be described, then reference unit 550 will be described.

Referring to FIG. 7, the analog inputs to magamp unit 520 are input to the $V_{IH}$ and $V_{IL}$ inputs at 218 and 220, respectively. This differential input is input to the bases of bipolar npn transistors 602 and 604 via lines 600 and 687, respectively. These analog inputs also are input to the $V_{IH}$ input at 630 and the $V_{IL}$ input at 632 of comparator 633.

Comparator 633, like comparator 255 in FIG. 3, receives the inputs just described and generates an output of a desired gain that is used to drive the current switching transistors that includes npn transistors 646, 648, 670, and 672.

Bipolar npn transistors 602 and 604 are part of a differential input amplifier stage that connects between $V_{CC}$ 270 and $V_{EE}$ 272. Referring first to the first branch of the differential amplifier that includes input transistor 602, the emitter of input transistor 602 connects to $V_{EE}$ 272 at node 616 through current source 610. The collector of transistor 602 connects to $V_{CC}$ 270 at nodes 658 and 682 though transistor pair 646 and 648. Line 640 connects between the collector of transistor 602 and node 642 on line 644. Line 644 connects the emitters of transistors 646 and 648.

Line 650 connects the collector of transistor 646 to $V_{CC}$ 270 at node 658. Current source 656 is disposed in line 650. Nodes 652 and 654 are disposed in line 650 below current source 656.

The collector of transistor 648 connects to $V_{CC}$ 270 at node 682 via line 660, node 676, and line 674. Line 660 connects the collector of transistor 648 to node 676. Node 676 is disposed in line 674. Line 674 connects the collector of transistor 670 to $V_{CC}$ 270 at node 682. Current source 680 is disposed in line 674 above node 676. Node 678 is disposed in line 674 below current source 680.

Node 652 is disposed in line 650, which connects the collector of transistor 646 and $V_{CC}$ 270 at node 658. Line 684 connects node 652 to the collector of npn bipolar transistor 672. This transistor will be discussed subsequently.

Node 654 also is disposed in line 650. Line 657 connects node 654 to node 524 that is common with reference unit 550. Line 700 connects to node 654 and to the emitter of bipolar pnp transistor 702. The collector of bipolar pnp transistor 702 is connected to line 706 that connects the collector to $V_{EE}$ 272 at node 712. Load resistor 710 is disposed in line 706.

Node 708 is disposed in line 706 between the collector of bipolar pnp transistor 702 and load resistor 710. Line 714 connects node 708 to the base of bipolar pnp transistor 716. Line 720 connects the emitter of bipolar pnp transistor 716 to $V_{CC}$ 270 at node 724. Current source 722 is disposed in line 720. The collector of bipolar pnp transistor 716 is connected to $V_{EE}$ 272 at node 730 by line 728.

Node 726 is disposed on line 720 between the emitter of bipolar pnp transistor 716 and current source 722. Line 525 connects this node to the $V_{OH}$ output at node 232.

Now referring to the second branch of the differential input amplifier that includes input transistor 604, the emitter of input transistor 604 connects to $V_{EE}$ 272 at node 618 through current source 614. Line 612 makes this connection.

Line 613 connects between node 617 in line 608 and node 619 in line 612. Resistor 615 is disposed in line 613. Transistors 602 and 604, and resistor 615 are used conventionally for linear conversion of the analog inputs.

The collector of transistor 604 connects to $V_{CC}$ 270 at nodes 658 and 682 though transistor pair 670 and 672. Line 662 connects the collector of transistor 604 to node 664, and node 664 in disposed in line 668. The emitters of transistors 670 and 672 are connected to line 668.

As stated, line 674 connects the collector of transistor 670 to $V_{CC}$ 270 at node 682. Current source 680 is disposed in line 674.

The collector of transistor 672 connects to $V_{CC}$ 270 at node 658 via line 684, node 652, and line 650. Line 684 connects the collector of transistor 672 to node 652. Node 652 is disposed in line 650. Line 650 connects the collector of transistor 672 to $V_{CC}$ 270 at node 658. Node 652 connects to line 650 below current source 656.

Node 678 is disposed in line 674. Line 679 connects node 678 to node 522 that is common with reference unit 550. Line 732 connects to node 678 and to the emitter of bipolar pnp transistor 734. The collector of bipolar pnp transistor 734 is connected to line 736 that connects this collector to $V_{EE}$ 272 at node 742. Load resistor 740 is disposed in line 736.

Node 738 is disposed in line 736 between the collector of bipolar pnp transistor 734 and load resistor 740. Line 746 connects node 738 to the base of bipolar pnp transistor 748. Line 750 connects the emitter of bipolar pnp transistor 748 to $V_{CC}$ 270 at node 756. Current source 754 is disposed in line 750. The collector of bipolar pnp transistor 748 is connected by line 758 to $V_{EE}$ 272 at node 760.

Node 752 is disposed on line 750 between the emitter of bipolar pnp transistor 748 and current source 754. Line 527 connects this node to the $V_{OL}$ output at node 234.

It is to be noted that transistors 702 and 734 are connected in an inverted, cascode manner, which helps increase the speed of the device and eliminate mid-scale errors due to the early voltage effects of transistors 646, 648, 672, and 670.

Referring to FIG. 8, reference unit 550 has two differential amplifiers. The first includes bipolar npn transistors 852 and 868 and is used for pulling the offset currents from node 522 carrying the $V_1$ signal and from node 524 carrying the $V_2$ signal. The second differential amplifier includes bipolar npn transistors 802 and 826 and is used for accurately referencing the full-scale output range of magamp unit 520.

The $V_{RIH}$ input to reference unit 550 at node 530 connects to line 800. This line connects to the bases of bipolar npn transistors 802 and 852. In a similar manner, the $V_{RIL}$ input to reference unit 550 at node 532 connects to line 824. Line 824 connects to the bases of bipolar npn transistors 826 and 868. First, the differential amplifier that includes bipolar npn transistors 852 and 868 will be discussed, then the differential amplifier that includes bipolar npn transistors 802 and 826 will be discussed.

The collector of bipolar npn transistor 852 connects to the emitter of bipolar npn transistor 856 via line 854. The collector of bipolar npn transistor 856 connects to node 522 carrying the $V_1$ signal via line 858. Line 860 connects to the emitter of bipolar npn transistor 852 to $V_{EE}$ 272 at node 866. Current source 864 is disposed in line 860. Node 862 is disposed in line 860 above current source 864.

Now with respect to the other branch of the first differential amplifier, the collector of bipolar npn transistor 868 connects to the emitter of bipolar npn transistor 872 via line 870. The collector of bipolar npn transistor 872 connects to node 524 carrying the $V_2$ signal via line 874. Line 876 connects to the emitter of bipolar npn transistor 868. Line 876 connects to $V_{EE}$ 272 at node 882. Current source 880 is disposed in line 876. Node 878 is disposed in line 876 above current source 880.

Node 862 in line 860 is connected to node 878 in line 876 by line 884. Resister 886 is disposed in line 884. Transistors 852 and 868, and resistor 886 are used conventionally for linear conversion of the input signal to a differential output current.

Line 888 connects to the bases of bipolar npn transistors 806, 830, 856, and 872. Node 890 is disposed in line 888. Line 892 connects nodes 890 and 894. This provides the appropriate bias voltage to bipolar npn transistors 806, 830, 856, 872, 898, and 926 so that they will conduct.

With respect to the second differential amplifier, the collector of bipolar npn transistor 802 is connected to the emitter of bipolar npn transistor 806 by line 804. Line 808 connects the collector of bipolar npn transistor 806 to node 814 in $V_{CC}$ 270. Current source 812 is disposed in line 808 and node 810 is disposed in line 808 below current source 812.

The emitter of bipolar npn transistor 802 connects to line 816. This line connects to $V_{EE}$ 272 at node 822. Current source 820 is disposed in line 816, and node 818 is disposed in line 816 above current source 820. Line 896 connects to node 810 and to the emitter of bipolar pnp transistor 898. The collector of bipolar pnp transistor 898 is connected to line 900 that connects the collector to $V_{EE}$ 272 at node 906. Load resistor 904 is disposed in line 900.

Node 902 is disposed in line 900 between the collector of bipolar pnp transistor 898 and load resistor 904. Line 908 connects node 902 to the base of bipolar pnp transistor 910. Line 912 connects the emitter of bipolar pnp transistor 910 to $V_{CC}$ 270 at node 918. Current source 916 is disposed in line 912. The collector of bipolar pnp transistor 910 is connected to $V_{EE}$ 272 at node 922 by line 920.

Node 914 is disposed on line 912 between the emitter of bipolar pnp transistor 910 and current source 916. Line 554 connects this node to the $V_{ROL}$ output at 514.

Considering the other branch of the second differential amplifier, the collector of bipolar npn transistor 826 is connected to the emitter of bipolar npn transistor 830 by line 828. Line 832 connects the collector of bipolar npn transistor 830 to node 838 in $V_{CC}$ 270. Current source 836 is disposed in line 832 and node 834 is disposed in line 832 below current source 836.

The emitter of bipolar npn transistor 826 connects to line 840. This line connects to $V_{EE}$ 272 at node 846. Current source 844 is disposed in line 840 and node 842 is disposed in line 840 above current source 844.

Node 818 in line 816 is connected to node 842 in line 840 by line 848. Resister 850 is disposed in line 848. Transistors 802 and 826, and resistor 850 are used conventionally for linear conversion of the input signals.

Line 924 connects to node 834 in line 832 and to the emitter of bipolar pnp transistor 926. The collector of bipolar pnp transistor 926 is connected to line 928 that connects the collector to $V_{EE}$ 272 at node 933. Load resistor 932 is disposed in line 928.

Node 930 is disposed in line 928 between the collector of bipolar pnp transistor 926 and load resistor 932. Line 934 connects node 930 to the base of bipolar pnp transistor 936. Line 938 connects the emitter of bipolar pnp transistor 936 to $V_{CC}$ 270 at node 944. Current source 942 is disposed in line 938. The collector of bipolar pnp transistor 936 is connected by line 946 to $V_{EE}$ 272 at node 948.

Node 940 is disposed on line 938 between the emitter of bipolar pnp transistor 936 and current source 942. Line 552 connects this node to the $V_{ROH}$ output at 512.

It is to be noted that transistors 898 and 926 are connected in an inverted, cascode manner to properly match the gain of magamp unit 520.

Line 704 connects to the bases of bipolar pnp transistors 898 and 926 in FIG. 8 and bipolar pnp transistors 702 and 734 in FIG. 7. The voltage on this line is derived from voltage source 952 in line 950. Line 950 connects between node 958 in line 704 and $V_{CC}$ 270 at node 954.

Referring to FIGS. 1A, 1C, 7, and 8, when magamp unit 520 and reference unit 550 are in operation, the signals input to magamp unit 520 are as shown in FIG. 1A and the output signals are as shown in FIG. 1C.

Magamp 1,502, which is the second embodiment of the magamp of present invention, operates faster than the magamp, such as magamp 1,202, of the first embodiment of the present invention because of the inverted, cascode transistors and the placement of the load resistors in the magamp unit 520. As such, there will be low impedance at node 654 for the $V_2$ signal and at node 678 for the $V_1$ signal of magamp unit 520, and low parasitic capacitance at nodes 708 and 738. This overall configuration therefore, greatly increases the speed of the device.

Given the forgoing, magamp unit 520 and reference unit. 550 operate as follows. Again referring to FIGS. 1A, 1C, 7, and 8, when the $V_{IH}$ input at 218 is LOW and the $V_{IL}$ input at 220 is HIGH, as shown in FIG. 1A, the output of comparator 633 on line 540 for the B output is LOW and on line 542, the negative true output, for the $B_N$ output is HIGH. This will cause transistors 648 and 672 to conduct. The $V_1$ and $V_2$ signals at nodes 522 and 524, respectively, are input from reference unit 550. Through the differential amplifier that includes bipolar npn transistors 852, 868, 856, and 872, and resistor 886, offset current is pulled from both sides of magamp unit 520 through nodes 522 and 524 for aligning the output signals. These offset currents are not pulled directly from the output of the differential amplifier so the problems that may be caused by it do not occur.

The aligned signals are output for magamp unit 520 at the $V_{OH}$ output at 232 and the $V_{OL}$ output at 234. These outputs are input to the next magamp stage. The outputs of the reference unit amplifier, the $V_{ROH}$ and $V_{ROL}$ outputs, are the differential reference voltage for input to reference unit 550 of the next successive magamp. This will compensate for any gain errors in each magamp stage.

Once the $V_{IH}$ input at 218 becomes greater than the $V_{IL}$ input at 220, the outputs of comparator 633 switch such that the B output on line 540 is HIGH and the $B_N$ output on line 542 is LOW. This will cause transistors 648 and 672 to stop conducting and transistors 646 and 670 to conduct. This also will result in the output lying on the folded curves for the $V_{OH}$ and $V_{OL}$ outputs, as shown in FIG. 1C.

The increased speed at which magamp 502 operates is due to the position of load resistors in magamp unit 520 and the use of high speed bipolar pnp transistors in these units that are connected in an inverted, cascode manner. A particular advantage that this configuration provides with respect to increasing speed in that it significantly reduces the parasitics at resistors 710 and 740. Moreover, this configuration permits the circuit designer to select a desired gain for the magamp and not be restricted to a particular or accurate gain for which the half-scale offset must be compensated.

Figure 9:
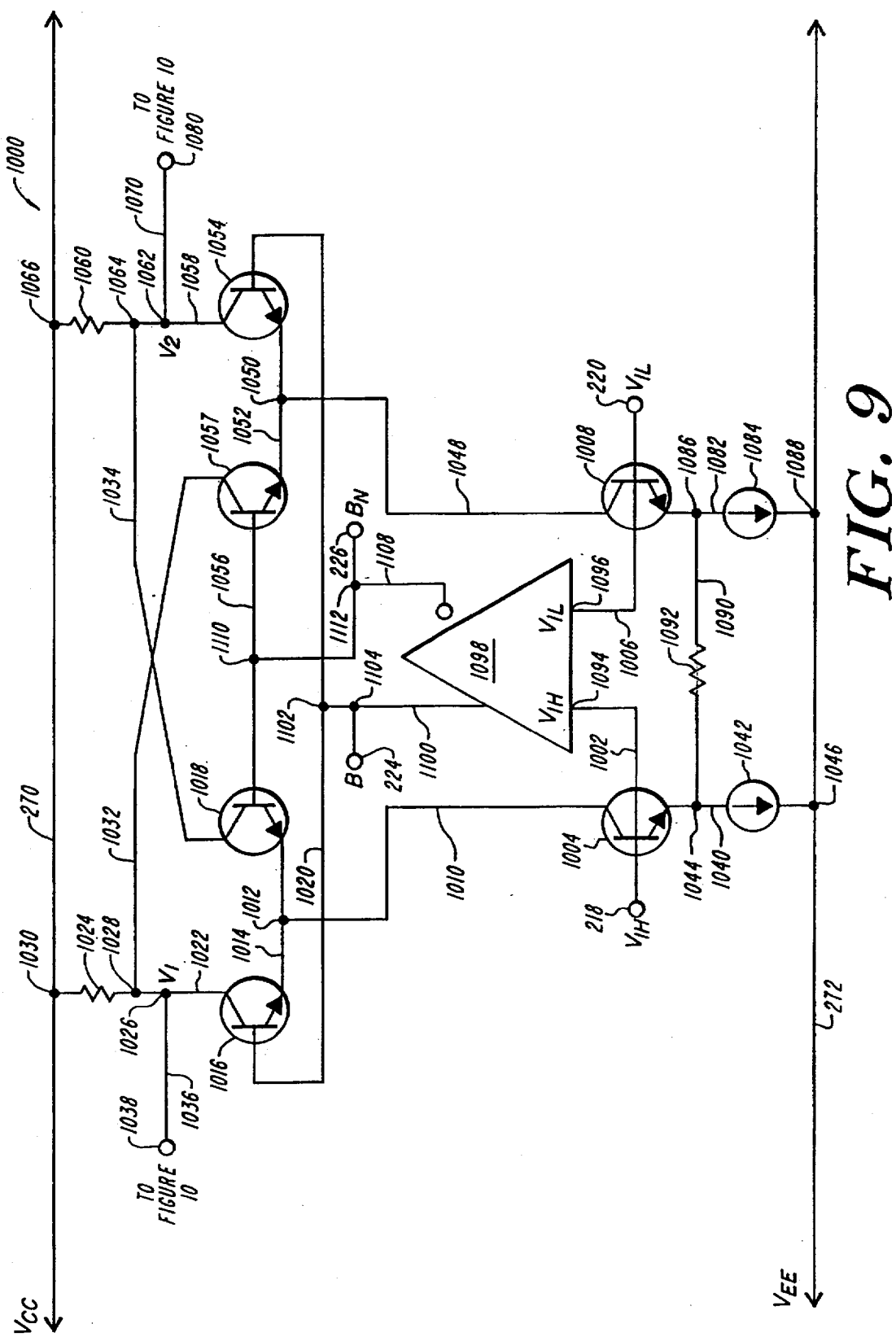
FIG. 9 shows another embodiment of the magamp unit for a magamp of the present invention.
Figure 10:
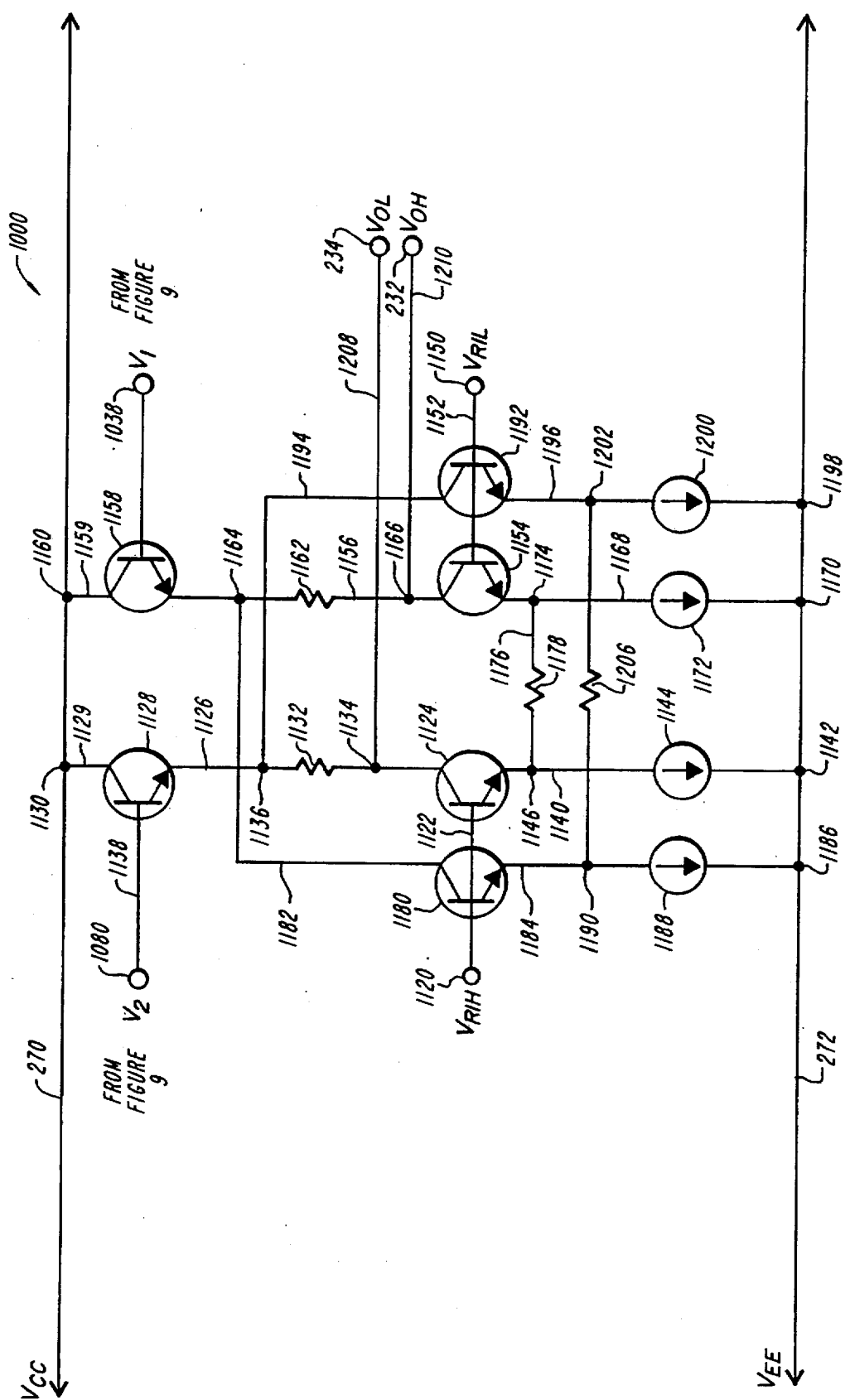
FIG. 10 shows another embodiment of a reference unit for a magamp of the present invention.

Referring to FIGS. 9 and 10, a third embodiment of the magamp of the present invention is shown generally at 1000. The magamp of the third embodiment includes the differential amplifier with current switching transistors (FIG. 9) and offset circuitry (FIG. 10). First, the differential amplifier with current switching transistors (FIG. 9) will be discussed, then the offset circuitry (FIG. 10) will be discussed.

Referring to FIG. 9, the analog inputs to the differential amplifier are input at the $V_{IH}$ and $V_{IL}$ inputs at 218 and 220, respectively. The analog inputs are the input to the bases of bipolar npn transistors 1004 and 1008, respectively. The analog signals also are input to comparator 1098 at the $V_{IH}$ input at 1094 and $V_{IL}$ input at 1096.

Bipolar npn transistors 1004 and 1008 are differential input transistors and connect between $V_{CC}$ 270 and $V_{EE}$ 272. The emitter of input transistor 1004 connects to $V_{EE}$ 272 through current source 1042. Node 1044 is disposed in line 1040 above current source 1042. The collector of transistor 1004 connects to $V_{CC}$ 270 though transistor pair 1016 and 1018 of the circuit switching transistors. Line 1010 connects the collector of transistor 1004 to node 1012 in line 1014. Line 1014 connects the emitters of transistors 1016 and 1018.

Line 1022 connects the collector of transistor 1016 to $V_{CC}$ 270 at node 1030. Load resistor 1024 is disposed in line 1022. Nodes 1026 and 1028 are disposed in line 1022 below load resistor 1024.

The collector of transistor 1018 connects to $V_{CC}$ 270 at node 1066 via line 1034, node 1064, line 1058, and load resistor 1060. Line 1034 connects the collector of transistor 1018 to node 1064. Node 1064 is disposed in line 1058. Line 1058 connects the collector of transistor 1054 to $V_{CC}$ 270 at node 1066. Load resistor 1060 is disposed in line 1058. Node 1064 connects to line 1058 below load resistor 1060.

As stated, node 1026 is disposed in line 1022. Line 1036 connects between node 1026 and node 1038. The signal at node 1038 is the folded $V_1$ signal. Further, as stated, node 1028 also is disposed in line 1022. Line 1032 connects node 1028 to the collector of npn bipolar transistor 1057. This transistor will be discussed subsequently.

Now referring the branch of the differential amplifier in FIG. 9 that includes transistor 1008. Line 1082 connects the emitter of input transistor 1008 $V_{EE}$ 272 at node 1088 through current source 1084. Node 1086 is disposed in line 1082 above current source 1084.

Line 1090 connects between nodes 1044 and 1086 in lines 1040 and 1082, respectively. Resistor 1092 is disposed in line 1090. Transistors 1004 and 1008, and resistor 1092 are used conventionally for linear conversion of the analog inputs.

The collector of transistor 1008 connects to $V_{CC}$ 270 though transistor pair 1054 and 1057 of the current switching transistors. Line 1048 connects the collector of transistor 1008 to node 1050 in line 1052. Line 1052 connects the emitters of transistors 1054 and 1057.

As stated, line 1058 connects the collector of transistor 1054 to $V_{CC}$ 270 at node 1066. Load resistor 1060 is disposed in line 1058. Nodes 1062 and 1064 are disposed in line 1058 below load resistor 1060.

The collector of transistor 1057 connects to $V_{CC}$ 270 at node 1030 via line 1032, node 1028, line 1022, and load resistor 1024.

Line 1032 connects the collector of transistor 1057 to node 1028. As stated, node 1028 is disposed in line 1022. Line 1022 connects the collector of transistor 1016 to $V_{CC}$ 270 at node 1030. Load resistor 1024 is disposed in line 1022. Node 1028 connects to line 1022 below load resistor 1024.

As stated, node 1062 is disposed in line 1058. Line 1070 connects between node 1062 and node 1080. The signal at node 1080 is the folded $V_2$ signal.

Comparator 1098 may be a conventional differential pair, such as the one shown in FIG. 4. With respect to comparator 1098, the $V_{IH}$ input at 1094 receives the signal from node 218 and the $V_{IL}$ input at 1096 receives the signal at node 220.

The B output of comparator 1098 on line 1100 connects to node 1102 that is disposed in line 1020. Line 1020 connects to the bases of transistors 1016 and 1054 of the current switching transistors. Node 1104 in line 1100 connects to node 224, which is the B output node.

The $B_N$ output of comparator 1098 on line 1108 connects to node 1110 that is disposed in line 1056. Line 1056 connects to the bases of transistors 1018 and 1057 of the current switching transistors. Node 1112 in line 1108 connects to node 226, which is the $B_N$ output node.

Figure 1B:
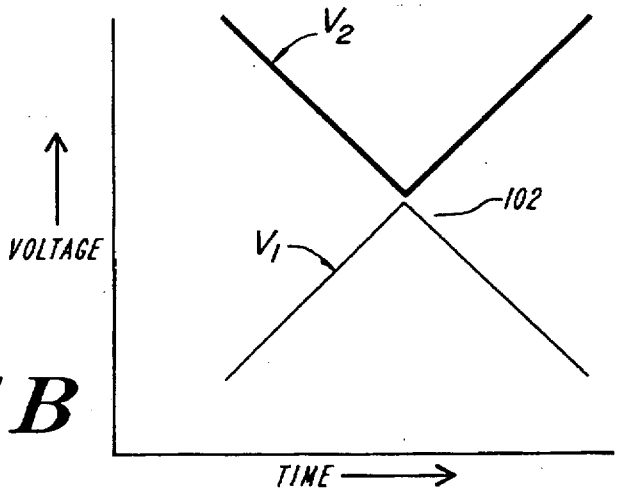
FIG. 1B is a graph of the intermediate folded signals of a serial-type A/D converter that has a folding cell.
Figure 1C:
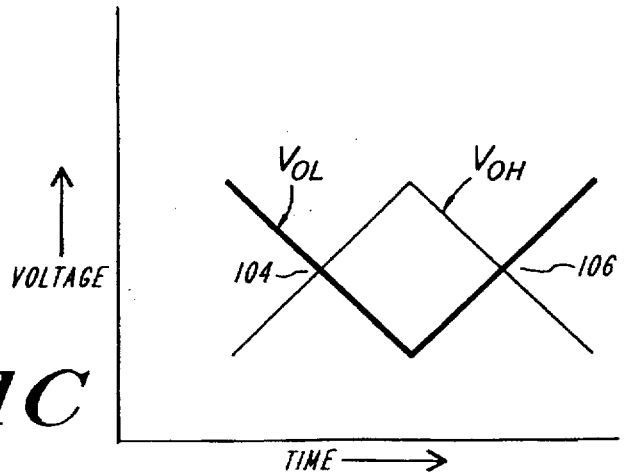
FIG. 1C is a graph of outputs of a serial-type A/D converter that has a folding cell and such outputs have been aligned for input to a next stage of the serial-type A/D converter.

The signals at nodes 1038 and 1080 are the folded but offset as shown in FIG. 1B. The offset circuit in FIG. 10 will now be discussed. This circuit aligns the signals as shown in FIG. 1C.

Referring to FIG. 10, the $V_{RIH}+$ signal is input at the $V_{RIH}$ input 1120. This signal is input to line 1122 that connects to the bases of bipolar npn transistors 1124 and 1180. Similarly, the $V_{RIL}-$ signal is input at the $V_{RIL}$ input at node 1150. This signal is input to line 1152 that connects to the bases of bipolar npn transistors 1154 and 1192. The offset circuitry has two differential amplifiers. The first includes transistors 1124 and 1154 and the second includes transistors 1180 and 1192. The first differential amplifier will be discussed, then the second will be discussed.

With regard to the first differential amplifier, line 1126 connects the collector of transistor 1124 to the emitter of bipolar npn transistor 1128. Load resistor 1132 is disposed in line 1126. Node 1134 is disposed in line 1126 below load resistor 1132 and node 1136 is disposed above load resistor 1132. Line 1129 connects the collector of transistor 1128 to node 1130 on $V_{CC}$ 270.

The emitter of transistor 1124 connects to line 1140 that connects to $V_{EE}$ 272 at node 1142. Current source 1144 is disposed in line 1140. Node 1146 is disposed in line 1140 above current source 1144.

Line 1208 connects node 1134 in line 1126 to the $V_{OL}$ output at 234.

Line 1156 connects the collector of transistor 1154 to the emitter of bipolar npn transistor 1158. Load resistor 1162 is disposed in line 1156. Node 1166 is disposed in line 1156 below load resistor 1162 and node 1164 is disposed above load resistor 1162. Line 1159 connects the collector of transistor 1158 to node 1160 on $V_{CC}$ 270.

Line 1210 connects node 1166 in line 1156 to the $V_{OH}$ output node at 232.

The emitter of transistor 1154 connects to line 1168 that connects to $V_{EE}$ 272 at node 1170. Current source 1172 is disposed in line 1168. Node 1174 is disposed in line 1168 above current source 1172.

Line 1176 connects node 1146 in line 1140 to node 1174 in line 1168. Resistor 1176 is disposed in line 1178. Transistors 1124 and 1154, and resistor 1178 are used conventionally.

Now referring to the second differential amplifier that includes bipolar npn transistors 1180 and 1192. This amplifier is used to generate compensation currents for transistors 1128 and 1158.

Line 1182 connects the collector of transistor 1180 to node 1164 in line 1156 above load resistor 1162. Node 1164 connects to the emitter of transistor 1158 via line 1156. The collector of transistor 1158 connects to $V_{CC}$ 270 at node 1160 via line 1159. Line 1184 connects the emitter of transistor 1180 to $V_{EE}$ 272 at node 1186. Current source 1188 is disposed in line 1184 and node 1190 is disposed in line 1184 above current source 1188.

Line 1194 connects the collector of transistor 1192 to node 1136 in line 1126 above load resistor 1132. Node 1136 connects to the emitter of transistor 1128 via line 1126. The collector of transistor 1128 connects to $V_{CC}$ 270 at node 1130 via line 1128. Line 1196 connects the emitter of transistor 1192 to $V_{EE}$ 272 at node 1198. Current source 1200 is disposed in line 1196 and node 1202 is disposed in line 1196 above current source 1200.

Line 1204 connects between node 1190 in line 1184 and node 1202 in line 1196. Resistor 1206 is disposed in line 1204. Transistors 1180 and 1192, and resistor 1206 are used conventionally.

In order to align the offset voltages shown in FIG. 1B, it is necessary for the load resistors of the differential amplifier in FIG. 9 and the load resistors in the offset circuitry in FIG. 10 to have a predetermined value relationship. Preferably, if load resistors 1024 and 1060 of the differential amplifier has a value of $R_L$, then load resistors 1162 and 1132 of the offset circuitry should have a value of $R_L/2$. Further, resistor 1092 of the differential amplifier should match resistors 1178 and 1206 of the differential pairs of the offset circuitry shown in FIG. 10 and current sources 1042 and 1084 should match current sources 1188, 1144, 1172, and 1200.

In operation, when the $V_{IH}$ input at 218 is LOW and the $V_{IL}$ input at 220 is HIGH, as shown in FIG. 1A, the output of comparator 1098 on line 1100 for the B output is LOW and on line 1108, the negative true output, for the $B_N$ output is HIGH. This will cause transistors 1018 and 1057 to conduct. As such, the $V_1$ and $V_2$ signals will lie on the unfolded curves for the $V_1$ and $V_2$ signals in FIG. 1B. During this time, transistors 1016 and 1054 of the current switching circuit do not conduct.

Once the $V_{IH}$ input at 218 becomes greater than the $V_{IL}$ input at 220 FIG. 1A, the outputs of comparator 1098 switch such that the B output on line 1100 is HIGH and the $B_N$ output on line 1108 is LOW. This will cause transistors 1018 and 1057 to stop conducting and transistors 1016 and 1054 to conduct. This will result in the $V_1$ and $V_2$ signals lying on the folded curves for the $V_1$ and $V_2$ signals in FIG. 1B To make the $V_1$ and $V_2$ signals usable for the next stage magamp, the offset circuitry in FIG. 10 is used. This circuitry aligns the signals and establishes the full-scale input range of the magamp. The difference between the $V_{RIH}$ signal at node 1120 and the $V_{RIL}$ signal at node 1150 is equal the full-scale input range. The offset currents are generated through resistors 1132 and 1162 which result in the aligning of the signals output at the $V_{OH}$ output at node 232 and the $V_{OL}$ output at node 234, as shown in FIG. 1C. The currents generated by the differential pair comprised of transistors 1180 and 1192, and resistor 1206 compensate for the equal offset currents that flow through the emitters of transistors 1128 and 1158 and minimize offset errors. The folded and aligned signals are fed to the next magamp stage.

The configuration in FIGS. 9 and 10 permits the circuit designer to select the gain for a particular stage of a series of connected stages by controlling the resistor value relationship in a particular stage. This configuration also does not have early voltage, $V_A$, problems at the current switching transistor because the offset circuits are not taken from the outputs of the differential amplifier shown in FIG. 9.

The terms and expressions that are used herein are terms of expression and not of limitation. There is no intention in the use of such terms and expressions of excluding the equivalents of the features shown and described, or portions thereof, it being recognized that various modifications are possible in the scope of the invention.

We claim:

1. A magnitude amplifier (magamp) for receiving a differential analog input and for providing an amplified signal at a first output and a second output, the magamp comprising:
   a differential input circuit for receiving and amplifying the differential analog input;
   a current switching circuit, coupled to the differential input circuit, for folding the differential analog input at a predetermined relationship between first and second signals of the differential analog input to provide a First folded signal and a second folded signal;
   a comparator for receiving the differential analog input and generating first and second control signals for controlling the current switching circuit;
   first output means that connects to the current switching circuit, the first output means receiving the first folded signal and providing a first output signal to the first output and including means for isolating the first folded signal from the first output;
   second output means that connects to the current switching circuit, the second output means receiving the second folded signal and providing a second output signal to the second output and including means for isolating the second folded signal from the second output; and
   alignment means coupled between the isolating means of at least one of the first and second output means and a respective at least one of the first and second outputs for aligning the output signals of the first and second output means such that a magnitude of one of the first and second folded signals is changed relative to a magnitude of the other.

2. The amplifier as recited in claim 1, wherein the differential input circuit includes a differential amplifier with first and second branches.

3. The amplifier as recited in claim 2, wherein the first branch has a first input transistor for receiving the first signal of the differential analog input, a first current source connected to the first input transistor, and a first load resistor connected to the current switching circuit.

4. The amplifier as recited in claim 3, wherein the first input transistor is a bipolar npn transistor.

5. The amplifier as recited in claim 3, wherein the second branch has a second input transistor for receiving the second signal of the differential analog input, a second current source connected to the second input transistor, and a second load resistor connected to the current switching circuit.

6. The amplifier as recited in claim 5, wherein the second input transistor is a bipolar npn transistor.

7. The amplifier as recited in claim 5, wherein the current switching circuit includes first, second, third, and fourth switching transistors, the first and second switching transistors forming a first portion of the current switching circuit and the third and fourth switching transistors forming a second portion of the current switching circuit.

8. The amplifier as recited in claim 7, wherein the first, second, third, and fourth switching transistors are bipolar npn transistors.

9. The amplifier as recited in claim 7, wherein first terminals of the first and fourth switching transistors are connected to receive the first control signal from the comparator, second terminals of the first and second switching transistors are connected to the first input transistor, a third terminal of the first switching transistor is connected to the first load resistor, and a third terminal of the second switching transistor is connected to the second load resistor.

10. The amplifier as recited in claim 9, wherein the first output means connects to a node between the third terminal of the first switching transistor and the first load resistor.

11. The amplifier as recited in claim 10, wherein the isolating means of the first output means includes an output transistor having an enabling terminal connected to the node, and an output current source connected to a first terminal of the output transistor, the first output of the magamp being connected to the first terminal of the output transistor.

12. The amplifier as recited in claim 9, wherein first terminals of the second and third switching transistors are connected to receive the second control signal from the comparator, second terminals of the third and fourth switching transistors are connected to the second input transistor, a third terminal of the third switching transistor is connected to the first load resistor, and a third terminal of the fourth switching transistor is connected to the second load resistor.

13. The amplifier as recited in claim 12, wherein the second output mean connects to a node between the third terminal of the fourth switching transistor and the second load resistor.

14. The amplifier as recited in claim 13, wherein the isolating means of the first output means includes a first output transistor having an enabling terminal connected to the first branch, and a first output current source connected to a first terminal of the first output transistor, the first output being connected to the first terminal of the first output transistor, and wherein the isolating means of the second output means includes a second output transistor having an enabling terminal connected to the second branch, a second output current source connected to a first terminal of the second output transistor, the second output being connected to the first terminal of the second output transistor.

15. A magnitude amplifier (magamp) for receiving a differential analog input and for providing an amplified signal at a first output and a second output, the magamp comprising:
   a first unit including:
      a first differential input circuit for receiving and amplifying the differential analog input,
      a current switching circuit, coupled to the first differential input circuit, for folding the differential analog input at a predetermined relationship between first and second signals of the differential analog input and for providing first and second folded signals,
      a comparator for receiving the differential analog input and for generating first and second control signals based on a comparison of the first and second signals of the differential analog input, the first and second control signals controlling the current switching circuit, and
      first and second output means connected to the current switching circuit for receiving the first and second folded signals, respectively, and for providing first and second output signals; and
   a second unit including:
      a second differential input circuit for receiving and amplifying a differential reference signal and for providing an offset current to the first unit to align the first and second folded signals such that a magnitude of one of the first and second folded signals is altered relative to the other, and
      third and fourth output means connected to the second differential input circuit for providing third and fourth output signals.

16. The amplifier as recited in claim 15, wherein the first differential input circuit includes a first differential amplifier with first and second branches.

17. The amplifier as recited in claim 16, wherein the first branch of the first differential amplifier has a first input transistor for receiving the first signal of the differential analog input, and a first current source, the amplifier further including at least a second current source connected to the current switching circuit.

18. The amplifier as recited in claim 17, wherein the first input transistor is a bipolar npn transistor.

19. The amplifier as recited in claim 17, wherein the second branch of the first differential amplifier has a second input transistor for receiving the second signal of the differential analog input, and a third current source, the amplifier further including at least a fourth current source connected to the current switching current.

20. The amplifier as recited in claim 19, wherein the second input transistor is a bipolar npn transistor.

21. The amplifier as recited in claim 19, wherein the current switching circuit includes first, second, third, and fourth switching transistors, the first and second switching transistors forming a first portion of the current switching circuit and the third and fourth switching transistors forming a second portion of the current switching circuit.

22. The amplifier as recited in claim 21, wherein the first, second, third, and fourth switching transistors are bipolar npn transistors.

23. The amplifier as recited in claim 21, wherein first terminals of the first and fourth switching transistors are connected to receive the first control signal from the comparator, second terminals of the first and second switching transistors are connected to the first input transistor, a third terminal of the first switching transistor is connected to the second current source, and a third terminal of the second switching transistor is connected to the fourth current source.

24. The amplifier as recited in claim 23, wherein the first output means connects to a first node between the third terminal of the first switching transistor and the second current source.

25. The amplifier as recited in claim 24, wherein the first output means includes a first inverted cascode transistor circuit that is connected to the first node, with the first inverted cascode transistor circuit including a first load resistor.

26. The amplifier as recited in claim 25, wherein the first inverted cascode transistor circuit includes a first cascode transistor with a first terminal connected to an enabling/disabling power source, a second terminal connected to the first node, and a third terminal connected to the first load resistor.

27. The amplifier as recited in claim 26, wherein the first cascode transistor is a pnp transistor.

28. The amplifier as recited in claim 23, wherein first terminals of the second and third switching transistors are connected to receive the second control signal from the comparator, second terminals of the third and fourth switching transistors are connected to the second input transistor, a third terminal of the third switching transistor is connected to the second current source, and a third terminal of the fourth switching transistor is connected to the fourth current source.

29. The amplifier as recited in claim 28, wherein the first output means connects to a first node of the first differential amplifier between the third terminal of the first switching transistor and the second current source in the first branch of the first differential amplifier, and wherein the second output means connects to a second node between the third terminal of the fourth switching transistor and the fourth current source in the second branch of the first differential amplifier.

30. The amplifier as recited in claim 29, wherein the first output means includes a first inverted cascode transistor circuit that is connected to the first node with the first inverted cascode transistor circuit including a first load resistor, and wherein the second output means includes a second inverted cascode transistor circuit that is connected to the second node with the second inverted cascode transistor circuit including a second load resistor.

31. The amplifier as retired in claim 30, wherein the first inverted cascode transistor circuit includes a first cascode transistor with a first terminal connected to an enabling/disabling power source, a second terminal connected to the first node, and a third terminal connected to the first load resistor, and wherein the second inverted cascode transistor circuit includes a second cascode transistor with a first terminal connected to the enabling/disabling power source, a second terminal connected to the second node, and a third terminal connected to the second load resistor.

32. The amplifier as recited in claim 31, wherein the first and second cascode transistors are pnp transistors.

33. The amplifier as recited in claim 31, wherein the second differential input circuit includes a second differential amplifier with first and second branches, and a third differential amplifier with first and second branches.

34. The amplifier as recited in claim 33, wherein the first branch of the second differential amplifier includes a third input transistor for receiving a first signal of the differential reference signal, a fifth current source, and a sixth current source.

35. The amplifier as recited in claim 34, wherein the third input transistor is a bipolar npn transistor.

36. The amplifier as recited in claim 34, wherein the second branch of the second differential amplifier includes a fourth input transistor for receiving a second signal of the differential reference signal, a seventh current source, and an eighth current source.

37. The amplifier as recited in claim 36, wherein the fourth input transistor is a bipolar npn transistor.

38. The amplifier as recited in claim 36, wherein the third output means includes a third inverted cascode transistor circuit with a third load resistor, the third inverted cascode transistor circuit being connected to the first branch of the second differential amplifier.

39. The amplifier as recited in claim 38, wherein the third inverted cascode transistor circuit includes a third cascode transistor with a first terminal connected to the enabling/disabling power source, a second terminal connected to the first branch of the second differential amplifier, and a third terminal connected to the third load resistor.

40. The amplifier as recited in claim 39, wherein the third cascode transistor is a pnp transistor.

41. The amplifier as recited in claim 38, wherein the fourth output means includes a fourth inverted cascode transistor circuit with a fourth load resistor, the fourth inverted cascode transistor circuit being connected to the second branch of the second differential amplifier.

42. The amplifier as recited in claim 41, wherein the third inverted cascode transistor circuit includes a third cascode transistor with a first terminal connected to the enabling/disabling power source a second terminal connected to the first branch of the second differential amplifier, and a third terminal connected to the third load resistor, and wherein the fourth inverted cascode transistor circuit includes a fourth cascode transistor with a first terminal connected to the enabling/disabling power source, a second terminal connected to the second branch of the second differential amplifier, and a third terminal connected to the fourth load resistor.

43. The amplifier as recited in claim 42, wherein the fourth cascode transistor is a pnp transistor.

44. The amplifier as recited in claim 42, wherein the first branch of the third differential amplifier includes a fifth input transistor for receiving the first signal of the differential reference signal, a ninth current source, and means for connecting the first branch of the third differential amplifier to the second branch of the first differential amplifier.

45. The amplifier as recited in claim 44, wherein the fifth input transistor is a bipolar npn transistor.

46. The amplifier as recited in claim 44, wherein the second branch of the third differential amplifier includes a sixth input transistor for receiving the second signal of the differential reference signal, a tenth current source, and means for connecting the second branch of the third differential amplifier to the first branch of the first differential amplifier.

47. The amplifier as recited in claim 46, wherein the sixth input transistor is a bipolar npn transistor.

48. The amplifier as recited in claim 15, wherein the second differential input circuit includes a first differential amplifier with first and second branches, and a second differential amplifier with first and second branches.

49. The amplifier as recited in claim 48, wherein the first branch of the first differential amplifier includes a first input transistor for receiving a first signal of the differential reference signal, a first current source, and a second current source.

50. The amplifier as recited in claim 49, wherein the second branch of the first differential amplifier includes a second input transistor for receiving a second signal of the differential reference signal, a third current source, and a fourth current source.

51. The amplifier as recited in claim 50, wherein the third output means includes a first inverted cascode transistor circuit with a first load resistor, the first inverted cascode transistor circuit being connected to the first branch of the differential amplifier.

52. The amplifier as recited in claim 51, wherein the first inverted cascode transistor circuit includes a first cascode transistor with a first control terminal, a second terminal connected to the first branch of the first differential amplifier, and a third terminal connected to the first load resistor.

53. The amplifier as recited in claim 51, wherein the fourth output means includes a second inverted cascode transistor circuit with a second load resistor, the second inverted cascode transistor circuit being connected to the second branch of the first differential amplifier.

54. The amplifier as recited in claim 53, wherein the first inverted cascode transistor circuit includes a first cascode transistor with a first control terminal, a second terminal connected to the first branch of the first differential amplifier, and a third terminal connected to the first load resistor, and wherein the second inverted cascode transistor circuit includes a second cascode transistor with a first control terminal, a second terminal connected to the second branch of the first differential amplifier, and a third terminal connected to the second load resistor.

55. A magnitude amplifier (magamp) comprising:
 a first unit including:
  a first differential input circuit for receiving and amplifying a differential analog input,
  a current switching circuit, connected to the first differential input circuit, for folding first and second signals of the differential analog input at a predetermined relationship between the signals of the differential analog input to provide first and second folded signals,
  a comparator for receiving the differential analog input and generating first and second control signals based on a comparison of the first and second signals of the differential analog input, the first and second control signals controlling the current switching circuit, and
  first and second output nodes that connect to the current switching circuit; and
 a second unit including:
  a second differential input circuit for receiving and amplifying a differential reference voltage and for providing offset current to align the first and second folded signals and for setting a full-scale input voltage range for the magamp, and
  third and fourth output nodes that connect to the second differential input circuit.

56. The amplifier as recited in claim 55, wherein the first differential input circuit includes a first differential amplifier with first and second branches.

57. The amplifier as recited in claim 56, wherein the first branch of the first differential amplifier has a first input transistor for receiving the first signal of the differential analog input, and a first current source, the amplifier further inducting at least a first load resistor connected to the current switching circuit.

58. The amplifier as recited in claim 57, wherein the first input transistor is a bipolar npn transistor.

59. The amplifier as recited in claim 57, wherein the second branch of the first differential amplifier has a second input transistor for receiving the second signal of the differential analog input, and a second current source, the amplifier further including at least a second load resistor connected to the current switching circuit.

60. The amplifier as recited in claim 59, wherein the second input transistor is a bipolar npn transistor.

61. The amplifier as recited in claim 59, wherein the current switching circuit includes first, second, third, and fourth switching transistors, the first and second switching transistors forming a first portion of the current switching circuit and the third and fourth switching transistors forming a second portion of the current switching circuit.

62. The amplifier as recited in claim 61, wherein the first second, third, and fourth switching transistors are bipolar npn transistors.

63. The amplifier as recited in claim 61, wherein first terminals of the first and fourth switching transistors are connected to the first control signal of the comparator, second terminals of the first and second switching transistors are connected to the first input transistor, a third terminal of the first switching transistor is connected to the first load resistor, and a third terminal of the second switching transistor is connected to the second load resistor.

64. The amplifier as recited in claim 63, wherein the first output node is between the third terminal of the first switching transistor and the first load resistor.

65. The amplifier as recited in claim 63, wherein first terminals of the second and third switching transistors are connected to the second control signal of the comparator, second terminals of the third and fourth switching transistors are connected to the second input transistor, a third terminal of the third switching transistor is connected to the first load resistor, and a third terminal of the fourth switching transistor is connected to the second load resistor.

66. The amplifier as recited in claim 65, wherein the second output node is between the third terminal of the fourth switching transistor and the second load resistor.

67. The amplifier as recited in claim 55, wherein the first differential input circuit includes a first differential amplifier with first and second branches, and the second differential input circuit includes a second differential amplifier with first and second branches.

68. The amplifier as recited in claim 67, wherein the first branch of the first differential amplifier includes a first input transistor for receiving the first signal of the differential analog input, a first current source, and a first load resistor, the amplifier further comprising a first isolating transistor connected to the second output node for passing signals from the second output node to the first branch of the second differential amplifier, but isolating the second output node from the first branch of the second differential amplifier.

69. The amplifier as recited in claim 58, wherein the first input transistor and the first isolating transistor are bipolar npn transistors.

70. The amplifier as recited in claim 58, wherein the second branch of the first differential amplifier includes a second input transistor for receiving the second signal of the differential analog input, a second current source, and a second load resistor, the amplifier further comprising a second isolating transistor connected to the first output node for passing signals from the first output node to the second branch of the second differential amplifier, but isolating the first output node from the second branch of the second differential amplifier.

71. The amplifier as recited in claim 70, wherein the second input transistor and the second isolating transistor are bipolar npn transistors.

72. The amplifier as recited in claim 70, wherein the first branch of the second differential amplifier includes a third input transistor for receiving a first input of the differential reference voltage and a third current source, the first branch of the second differential amplifier connecting to the first isolating transistor.

73. The amplifier as recited in claim 72, wherein the third input transistor is a bipolar npn transistor.

74. The amplifier as recited in claim 72, wherein the second branch of the second differential amplifier includes a fourth input transistor for receiving a second input of the differential reference voltage and a fourth current source, the second branch of the second differential amplifier connecting to the second isolating transistor.

75. The amplifier as recited in claim 74, wherein the fourth input transistor is a bipolar npn transistor.

76. An amplifier for receiving a differential analog input and for providing an output at first and second outputs, the amplifier comprising:

a differential input circuit for receiving the differential analog input;

a comparator for receiving the differential analog input and for providing first and second control signals;

a current switching circuit connected to the differential input circuit for folding the differential analog input in response to the first and second control signals;

a first transistor connected on a first side to the current switching circuit and on a second side to the first output;

a second transistor connected on a first side to the current switching circuit and on a second side to the second output; and a reference circuit coupled to control terminals of the first and second transistors for providing bias voltages thereto.

77. An amplifier for receiving a differential analog input and for providing an output at first and second outputs, the amplifier comprising:

a differential input circuit for receiving the differential analog input;

a comparator for receiving the differential analog input and for providing first and second control signals;

a current switching circuit connected to the differential input circuit for folding the differential analog input in response to the first and second control signals;

a first transistor connected on a first side to the current switching circuit and on a second side to the first output;

a second transistor connected on a first side to the current switching circuit and on a second side to the second output; and first and second output transistors, each having a control input coupled to the second side of the respective first and second transistors.

78. The amplifier of claim 77, further comprising first and second resistors coupled to the control inputs of the respective first and second output transistors.

79. An amplifier for receiving a differential analog input and for providing an output at first and second outputs, the amplifier comprising:

a differential input circuit for receiving the differential analog input;

a comparator for receiving the differential analog input and for providing first and second control signals;

a current switching circuit connected to the differential input circuit for folding the differential analog input in response to the first and second control signals;

a first cascode transistor connected on a first side to the current switching circuit and on a second side to the first output; and a second cascode transistor connected on a first side to the current switching circuit and on a second side to the second output;

wherein the first and second cascode transistors are pnp transistors having emitters connected to the current switching circuit and collectors coupled to the respective first and second outputs.

80. An amplifier system having a plurality of connected stages, each of the stages comprising:

an amplifier unit including:
  a differential input circuit for receiving a respective differential analog input signal,
  a comparator for receiving the respective differential analog input signal and for generating first and second control signals based on a relationship of the respective differential analog input signal,
  a current switching circuit connected to the differential input circuit for folding the respective differential analog input signal in response to the first and second control signals, and
  first and second output circuits connected to the current switching circuit for providing respective first and second output signals to a next stage; and a reference unit including:
  a second differential input circuit for receiving a respective differential reference signal, for providing an offset signal to align the first and second output signals, and for providing to the next stage a differential reference output signal.

81. The amplifier system of claim 80, wherein each reference unit has first and second differential transistor pairs, the first pair for providing the differential reference output signal, and the second pair for providing the offset signal.

82. The amplifier system of claim 81, wherein each reference unit has a third pair of transistors, each transistor in the second pair of transistors being connected on a first side to a respective one of the third pair of transistors and on a second side to a current source, the third pair of transistors being coupled to the first and second output circuits.

* * * * *